United States Patent
Tucker et al.

(10) Patent No.: US 10,504,305 B2
(45) Date of Patent: *Dec. 10, 2019

(54) STATISTICALLY EQUIVALENT LEVEL OF SAFETY MODELING FOR AIRCRAFT FLEETS

(71) Applicant: Bell Helicopter Textron Inc., Fort Worth, TX (US)

(72) Inventors: Brian Edward Tucker, Fort Worth, TX (US); Richard Marcos Muñiz, Euless, TX (US)

(73) Assignee: Textron Innovations Inc., Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/103,861

(22) Filed: Aug. 14, 2018

(65) Prior Publication Data
US 2018/0374287 A1    Dec. 27, 2018

Related U.S. Application Data

(63) Continuation of application No. 15/182,106, filed on Jun. 14, 2016, now Pat. No. 10,062,218.

(51) Int. Cl.
*G05B 23/02*      (2006.01)
*B64F 5/40*       (2017.01)
(Continued)

(52) U.S. Cl.
CPC .............. *G07C 5/0808* (2013.01); *B64F 5/40* (2017.01); *B64F 5/60* (2017.01); *G05B 23/0283* (2013.01); *G06F 17/5095* (2013.01); *B64D 45/00* (2013.01)

(58) Field of Classification Search
None
See application file for complete search history.

(56) References Cited

U.S. PATENT DOCUMENTS

| 8,200,442 B2 | 6/2012 | Adams et al. |
| 8,571,814 B2 | 10/2013 | Zhao et al. |

(Continued)

FOREIGN PATENT DOCUMENTS

| EP | 2230638 A2 | 9/2010 |
| EP | 2384971 A1 | 11/2011 |

OTHER PUBLICATIONS

Adams, et. al.; Searching for the Usage Monitor Reliability Factor Using an Advanced Fatigue Reliability Assessment Model; 65th Annual Forum of the American Helicopter Society, Grapevine TX, May 2009.

(Continued)

*Primary Examiner* — Abdhesh K Jha
(74) *Attorney, Agent, or Firm* — Lawrence Youst PLLC (57) ABSTRACT

Systems and methods are provided for statistically equivalent level of safety modeling. One method includes identifying sub-fleets within a fleet based upon usage profiles, determining a sub-fleet reliability value for each sub-fleet, determining a baseline fleet reliability for the fleet by combining the sub-fleet reliability values on a weighted basis, applying at least one credit to at least one sub-fleet, determining a post-credit sub-fleet reliability value for each sub-fleet based upon the at least one credit, determining a post-credit fleet reliability for the fleet by combining the post-credit sub-fleet reliability values on a weighted basis, comparing the baseline fleet reliability with the post-credit fleet reliability to identify a change in fleet reliability and determining whether the change in fleet reliability is within a predetermined threshold to validate the at least one credit.

18 Claims, 6 Drawing Sheets

(51) Int. Cl.
  *G07C 5/08*     (2006.01)
  *G06F 17/50*    (2006.01)
  *B64F 5/60*     (2017.01)
  B64D 45/00      (2006.01)

(56) References Cited

U.S. PATENT DOCUMENTS

| | | |
|---|---|---|
| 9,617,010 B2 | 4/2017 | Conrad |
| 2015/0274312 A1 | 10/2015 | Conrad |

OTHER PUBLICATIONS

European Examination Report, Application No. 1179576.0, EPO, dated Nov. 20, 2017.
European Search Report, Application No. 1179576.0, EPO, dated Oct. 27, 2017.
Tucker, et. al.; Development of a Fatigue Life Management System for Dynamic Components on the OH-58D Kiowa; Presented at the American Helicopter Society 68th Annual Forum, Fort Worth, Texas, May 1-3, 2012.

STATISTICALLY EQUIVALENT LEVEL OF SAFETY MODELING FOR AIRCRAFT FLEETS

CROSS-REFERENCE TO RELATED APPLICATIONS

This is a continuation of application Ser. No. 15/182,106 filed Jun. 14, 2016, now U.S. Pat. No. 10,062,218.

TECHNICAL FIELD OF THE DISCLOSURE

The present disclosure relates, in general, to time dependent aircraft reliability and, in particular, to a safety methodology for aircraft fleets utilizing statistically equivalent level of safety modeling to extend scheduled maintenance intervals for structural components based upon measured usage data of aircraft within the aircraft fleet.

BACKGROUND

Aircraft fleet operators are typically under tremendous pressure to operate their aircraft fleets as efficiently as possible. To achieve desired safety and reliability requirements, however, conservative usage assumptions are generally used to determine the life limits of various aircraft components. Usage credit has long been proposed as a means to extend scheduled maintenance intervals in an effort to reduce maintenance cost. These usage credits are typically determined through evaluation of actual aircraft usage of individual aircraft, which may have wide variation from the "usage as severe as expected" model. While such reliability methods have been used as a means to quantify the safety of individual aircraft, it has been acknowledged that much of the overall fleet safety achieved using current fatigue tolerance methods is due to the conservative nature of usage assumptions.

In one model, proposed usage credit is determined based upon detailed component reliability assessments that produce an absolute characterization of reliability or its complement, unreliability, as a function of service life to determine a life limit that provides acceptable safety. Such absolute assessment models, however, are only as good as the assumptions on the distributions of strength, loads and usage. In addition, variability in these factors, especially loads, is difficult to quantify such that absolute reliability methods, no matter how sophisticated, are difficult to validate. Accordingly, a need has arisen for an improved safety methodology for extending scheduled maintenance intervals of aircraft. A need has also arisen for such an improved safety methodology that allows for its level of impact on fleet reliability to be determined.

SUMMARY

One of the goals of a safety methodology that includes usage credit should be to ensure that a proposed change in component or aircraft airworthiness limitations preserves fleet reliability. Past experience has shown that current safe-life fatigue methodology has provided acceptable levels of fleet reliability for over 70 years in commercial rotorcraft operation, so this experience provides a standard by which other methods can be judged, regardless of the nature of assumptions made in the current safe-life fatigue methodology. In the present disclosure, an improved safety methodology for extending scheduled maintenance intervals of aircraft is provided that allows for its level of impact on fleet reliability to be determined.

In a first aspect, the present disclosure is directed to a statistically equivalent level of safety modeling method for structural components of aircraft within an aircraft fleet having (n) aircraft. The method includes (A) identifying a first aircraft sub-fleet based upon a first usage profile and a second aircraft sub-fleet based upon a second usage profile, the first aircraft sub-fleet having (m) aircraft and the second aircraft sub-fleet having (n–m) aircraft; (B) determining a first reliability value ($p_1$) for the first aircraft sub-fleet and a second reliability value ($p_2$) for the second aircraft sub-fleet; (C) determining a baseline fleet reliability ($p_{F1}$) for the aircraft fleet according to the formula: $(p_{F1})=(p_1)^m \times (p_2)^{n-m}$; (D) applying a credit to the second aircraft sub-fleet; (E) determining a post-credit reliability value ($p_{2C}$) for the second aircraft sub-fleet based upon the credit; (F) determining a post-credit fleet reliability ($p_{F2}$) for the aircraft fleet according to the formula: $(p_{F2})=(p_1)^m \times (p_2)^{n-m}$; (G) comparing the baseline fleet reliability ($p_{F1}$) with the post-credit fleet reliability ($p_{F2}$) to identify a change in fleet reliability; and (H) determining whether the change in fleet reliability is within a predetermined threshold to validate the credit applied to the second aircraft sub-fleet.

The method may also include basing usage profiles upon measured usage levels; using a less extreme usage profile for the second usage profile than the first usage profile; using time dependent probability distribution functions, time to failure probability distribution functions and/or any probability distribution function of discrete and/or continuous random variables including, but not limited to, normal distribution functions, log normal distribution functions and Poisson distribution functions; relating the reliability values to one or more structural components of the aircraft of the first and second aircraft sub-fleets; relating the reliability values to probability distribution functions based upon strength, loads and usage of the aircraft of the first and second aircraft sub-fleets; selecting the credit from the group consisting of life limit shifts, life factors and combination thereof and/or applying a revised credit if the change in fleet reliability is not within the predetermined threshold then repeating steps (E)-(H).

In a second aspect, the present disclosure is directed to a statistically equivalent level of safety modeling method for structural components of aircraft within an aircraft fleet. The method includes identifying aircraft sub-fleets within the aircraft fleet based upon aircraft usage profiles, each aircraft sub-fleet having a sub-fleet population; determining a sub-fleet reliability value for each aircraft sub-fleet; determining a baseline fleet reliability for the aircraft fleet by multiplying together the sub-fleet reliability values raised to the sub-fleet population for each aircraft sub-fleet; applying at least one credit to at least one aircraft sub-fleet; determining a post-credit sub-fleet reliability value for each aircraft sub-fleet based upon the at least one credit; determining a post-credit fleet reliability for the aircraft fleet by multiplying together the post-credit sub-fleet reliability values raised to the sub-fleet population for each aircraft sub-fleet; comparing the baseline fleet reliability with the post-credit fleet reliability to identify a change in fleet reliability; and determining whether the change in fleet reliability is within a predetermined threshold to validate the at least one credit.

In a third aspect, the present disclosure is directed to a statistically equivalent level of safety modeling method for structural components of a system within a system fleet. The method includes identifying sub-fleets within the fleet based upon usage profiles; determining a sub-fleet reliability value for each sub-fleet; determining a baseline fleet reliability for the fleet by combining the sub-fleet reliability values on a weighted basis; applying at least one credit to at least one sub-fleet; determining a post-credit sub-fleet reliability value for each sub-fleet based upon the at least one credit; determining a post-credit fleet reliability for the fleet by combining the post-credit sub-fleet reliability values on a weighted basis; comparing the baseline fleet reliability with the post-credit fleet reliability to identify a change in fleet reliability; and determining whether the change in fleet reliability is within a predetermined threshold to validate the at least one credit. The method may also include establishing the weighted basis based upon the number of systems in each sub-fleet.

In a fourth aspect, the present disclosure is directed to a statistically equivalent level of safety modeling system for structural components of aircraft within an aircraft fleet. The system includes a statistically equivalent level of safety modeling computing system having logic stored within a non-transitory computer readable medium, the logic executable by a processor, wherein the statistically equivalent level of safety modeling computing system is configured to identify a first aircraft sub-fleet based upon a first usage profile and a second aircraft sub-fleet based upon a second usage profile, the first aircraft sub-fleet having (m) aircraft and the second aircraft sub-fleet having (n–m) aircraft; determine a first reliability value ($p_1$) for the first aircraft sub-fleet and a second reliability value ($p_2$) for the second aircraft sub-fleet; determine a baseline fleet reliability ($p_{F1}$) for the aircraft fleet according to the formula: $(p_{F1})=(p_1)^m \times (p_2)^{n-m}$, apply a credit to the second aircraft sub-fleet; determine a post-credit reliability value ($p_{2C}$) for the second aircraft sub-fleet based upon the credit; determine a post-credit fleet reliability ($p_{F2}$) for the aircraft fleet according to the formula: $(p_{F2})=(p_1)^m \times (p_{2C})^{n-m}$, compare the baseline fleet reliability ($p_{F1}$) with the post-credit fleet reliability ($p_{F2}$) to identify a change in fleet reliability; and determine whether the change in fleet reliability is within a predetermined threshold to validate the credit applied to the second aircraft sub-fleet.

In a fifth aspect, the present disclosure is directed to a statistically equivalent level of safety modeling system for structural components of aircraft within an aircraft fleet. The system includes a statistically equivalent level of safety modeling computing system having logic stored within a non-transitory computer readable medium, the logic executable by a processor, wherein the statistically equivalent level of safety modeling computing system is configured to identify aircraft sub-fleets within the aircraft fleet based upon aircraft usage profiles, each aircraft sub-fleet having a sub-fleet population; determine a sub-fleet reliability value for each aircraft sub-fleet; determine a baseline fleet reliability for the aircraft fleet by multiplying together the sub-fleet reliability values raised to the sub-fleet population for each aircraft sub-fleet; apply at least one credit to at least one aircraft sub-fleet; determine a post-credit sub-fleet reliability value for each aircraft sub-fleet based upon the at least one credit; determine a post-credit fleet reliability for the aircraft fleet by multiplying together the post-credit sub-fleet reliability values raised to the sub-fleet population for each aircraft sub-fleet; compare the baseline fleet reliability with the post-credit fleet reliability to identify a change in fleet reliability; and determine whether the change in fleet reliability is within a predetermined threshold to validate the at least one credit.

In a sixth aspect, the present disclosure is directed to a statistically equivalent level of safety modeling system for structural components of aircraft within an aircraft fleet. The system includes a statistically equivalent level of safety modeling computing system having logic stored within a non-transitory computer readable medium, the logic executable by a processor, wherein the statistically equivalent level of safety modeling computing system is configured to identify sub-fleets within the fleet based upon usage profiles; determine a sub-fleet reliability value for each sub-fleet; determine a baseline fleet reliability for the fleet by combining the sub-fleet reliability values on a weighted basis; apply at least one credit to at least one sub-fleet; determine a post-credit sub-fleet reliability value for each sub-fleet based upon the at least one credit; determine a post-credit fleet reliability for the fleet by combining the post-credit sub-fleet reliability values on a weighted basis; compare the baseline fleet reliability with the post-credit fleet reliability to identify a change in fleet reliability; and determine whether the change in fleet reliability is within a predetermined threshold to validate the at least one credit.

In a seventh aspect, the present disclosure is directed to a non-transitory computer readable storage medium comprising a set of computer instructions executable by a processor for operating a statistically equivalent level of safety modeling system. The computer instructions are configured to identify a first aircraft sub-fleet based upon a first usage profile and a second aircraft sub-fleet based upon a second usage profile, the first aircraft sub-fleet having (m) aircraft and the second aircraft sub-fleet having (n–m) aircraft; determine a first reliability value ($p_1$) for the first aircraft sub-fleet and a second reliability value ($p_2$) for the second aircraft sub-fleet; determine a baseline fleet reliability ($p_{F1}$) for the aircraft fleet according to the formula: $(p_{F1})=(p_1)^m \times (p_2)^{n-m}$; apply a credit to the second aircraft sub-fleet; determine a post-credit reliability value ($p_{2C}$) for the second aircraft sub-fleet based upon the credit; determine a post-credit fleet reliability ($p_{F2}$) for the aircraft fleet according to the formula: $(p_{F2})=(p_1)^m \times (p_{2C})^{n-m}$; compare the baseline fleet reliability ($p_{F1}$) with the post-credit fleet reliability ($p_{F2}$) to identify a change in fleet reliability; and determine whether the change in fleet reliability is within a predetermined threshold to validate the credit applied to the second aircraft sub-fleet.

In an eighth aspect, the present disclosure is directed to a non-transitory computer readable storage medium comprising a set of computer instructions executable by a processor for operating a statistically equivalent level of safety modeling system. The computer instructions are configured to identify aircraft sub-fleets within the aircraft fleet based upon aircraft usage profiles, each aircraft sub-fleet having a sub-fleet population; determine a sub-fleet reliability value for each aircraft sub-fleet; determine a baseline fleet reliability for the aircraft fleet by multiplying together the sub-fleet reliability values raised to the sub-fleet population for each aircraft sub-fleet; apply at least one credit to at least one aircraft sub-fleet; determine a post-credit sub-fleet reliability value for each aircraft sub-fleet based upon the at least one credit; determine a post-credit fleet reliability for the aircraft fleet by multiplying together the post-credit sub-fleet reliability values raised to the sub-fleet population for each aircraft sub-fleet; compare the baseline fleet reliability with the post-credit fleet reliability to identify a change in fleet reliability; and determine whether the change in fleet reliability is within a predetermined threshold to validate the at least one credit.

In a ninth aspect, the present disclosure is directed to a non-transitory computer readable storage medium comprising a set of computer instructions executable by a processor for operating a statistically equivalent level of safety modeling system. The computer instructions are configured to identify sub-fleets within the fleet based upon usage profiles; determine a sub-fleet reliability value for each sub-fleet; determine a baseline fleet reliability for the fleet by combining the sub-fleet reliability values on a weighted basis; apply at least one credit to at least one sub-fleet; determine a post-credit sub-fleet reliability value for each sub-fleet based upon the at least one credit; determine a post-credit fleet reliability for the fleet by combining the post-credit sub-fleet reliability values on a weighted basis; compare the baseline fleet reliability with the post-credit fleet reliability to identify a change in fleet reliability; and determine whether the change in fleet reliability is within a predetermined threshold to validate the at least one credit.

BRIEF DESCRIPTION OF THE DRAWINGS

For a more complete understanding of the features and advantages of the present disclosure, reference is now made to the detailed description along with the accompanying figures in which corresponding numerals in the different figures refer to corresponding parts and in which.

DETAILED DESCRIPTION

While the making and using of various embodiments of the present disclosure are discussed in detail below, it should be appreciated that the present disclosure provides many applicable inventive concepts, which can be embodied in a wide variety of specific contexts. The specific embodiments discussed herein are merely illustrative and do not delimit the scope of the present disclosure. In the interest of clarity, not all features of an actual implementation may be described in the present disclosure. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would be a routine undertaking for those of ordinary skill in the art having the benefit of this disclosure.

Figure 1:
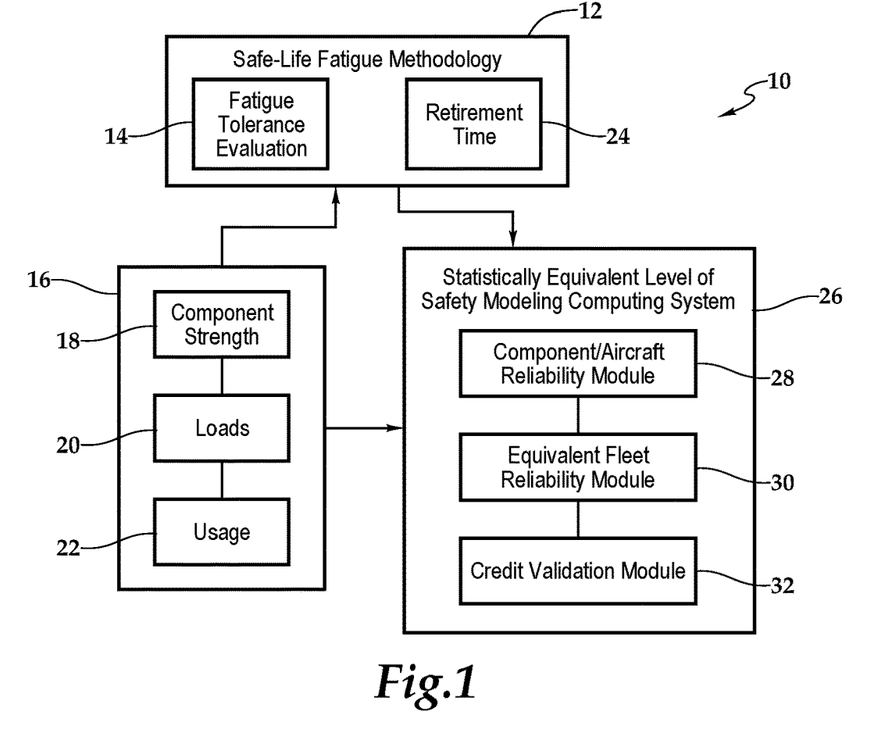
FIG. 1 is a flow diagram of a statistically equivalent level of safety modeling system for components or aircraft within an aircraft fleet in accordance with embodiments of the present disclosure.

Referring to FIG. 1 in the drawings, a flow diagram representing systems and methods for statistically equivalent level of safety modeling for structural components of aircraft within an aircraft fleet is generally designated 10. The systems and methods described herein provide a mechanism for extending scheduled maintenance intervals of aircraft and determining the level of impact on fleet reliability of such extensions. This is achieved, in part, by using current safe-life fatigue methodology 12, which has provided an acceptable level of fleet reliability for over 70 years in commercial rotorcraft operation (see 14 C.F.R. 29.571; which is hereby incorporated by reference). The present systems and methods utilize current safe-life fatigue methodology 12 as the standard or baseline against which the disclosed systems and methods are judged such that adjustments in maintenance intervals or credits can be validated. In addition, the present systems and methods leverage current safe-life fatigue methodology 12 using many of the same assumptions, which have been proven to yield overall fleet safety.

Safe-life fatigue methodology 12 utilize a fatigue tolerance evaluation 14 to analyze fatigue factors 16 including component strength 18, loads 20 and usage 22 relating to each principal structural element of an aircraft. The fatigue tolerance evaluation 14 establishes appropriate inspection intervals and/or retirement time 24 to avoid catastrophic failure during the operational life of an aircraft. For example, the fatigue tolerance evaluation 14 of principal structural elements may include in-flight measurements to determine the fatigue loads or stresses during all critical conditions throughout the range of design limitations using a loading spectra as severe as those expected in operations; a threat assessment which includes a determination of the probable locations, types and sizes of damage, taking into account fatigue, environmental effects, intrinsic and discrete flaws, or accidental damage that may occur during manufacture or operation; and a determination of the fatigue tolerance characteristics for the principal structural elements that supports the inspection and retirement times.

In the illustrated embodiment, a statistically equivalent level of safety modeling computing system 26 is used to identify sub-fleets within an aircraft fleet that may be candidates for a credit to extend inspection intervals and/or retirement time of components or aircraft based upon usage profiles and to validate the credit based upon the level of change in the overall fleet reliability resulting from the credit. Computing system 26 may be implemented on a general-purpose computer, a special purpose computer or other machine with memory and processing capability. For example, computing system 26 may include one or more memory storage modules including, but is not limited to, internal storage memory such as random access memory (RAM), non-volatile memory such as read only memory (ROM), removable memory such as magnetic storage memory, optical storage memory including CD and DVD media, solid-state storage memory including CompactFlash cards, Memory Sticks, SmartMedia cards, MultiMediaCards (MMC), Secure Digital (SD) memory or other suitable memory storage entity. Computing system 26 may be a microprocessor-based system operable to execute program code in the form of machine-executable instructions. In addition, computing system 26 may be connected to other computer systems via a proprietary encrypted network, a public encrypted network, the Internet or other suitable communication network that may include both wired and wireless connections. The communication network may be a local area network (LAN), wide area network (WAN), the Internet, or any other type of network that couples a plurality of computers to enable various modes of communication via network messages using as suitable communication technique, such as Transmission Control Protocol/Internet Protocol (TCP/IP), File Transfer Protocol (FTP), Hypertext Transfer Protocol (HTTP), Internet Protocol Security Protocol (IPSec), Point-to-Point Tunneling Protocol (PPTP), Secure Sockets Layer (SSL) Protocol or other suitable protocol.

Computing system 26 preferably includes a display device configured to display information including graphical user interfaces. The display device may be configured in any suitable form, including, for example, Liquid Crystal Displays (LCD), Light emitting diode displays (LED), Cathode Ray Tube Displays (CRT) or any suitable type of display. Computing system 26 and/or the display device may also include an audio output device such as speakers or an audio port allowing the user to hear audio output. The display device may also serve as a user interface device if a touch screen display implementation is used. Other user interface devices associated with computing system 26 may include a keyboard and mouse, a keypad, a touch pad, a video camera, a microphone and the like to allow a user to interact with computing system 26, programs operating on computing system 26 and other computing systems in communication with computing system 26.

Computing system 26 preferably includes a non-transitory computer readable storage medium including a set of computer instructions executable by a processor for statistically equivalent level of safety modeling. In the illustrated embodiment, the computer instructions include a component/aircraft reliability module 28, an equivalent fleet reliability module 30 and a credit validation module 32. It is to be understood by those skilled in the art that these and other modules executed by statistically equivalent level of safety modeling computing system 26 may be implemented in a variety of forms including hardware, software, firmware, special purpose processors and combinations thereof.

Figure 2:
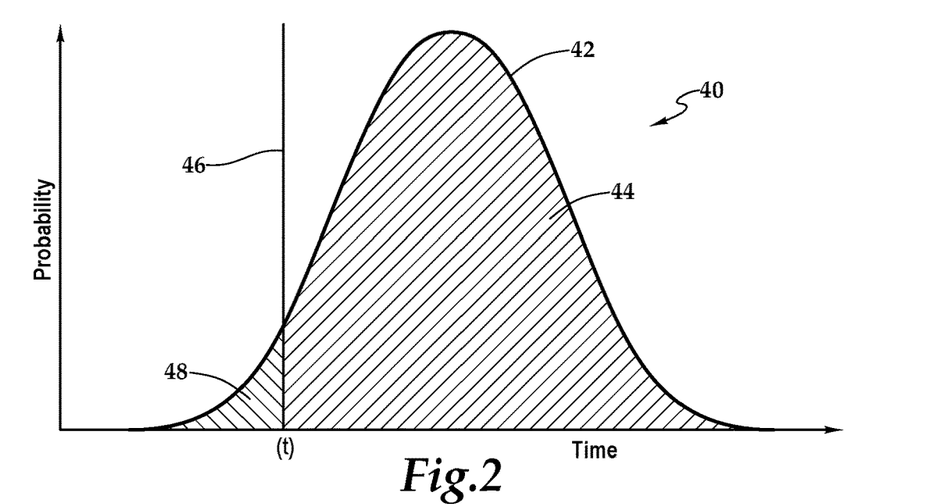
FIG. 2 is a time to failure probability distribution for components or aircraft within an aircraft fleet in accordance with embodiments of the present disclosure.

Referring to FIG. 2 in the drawings, therein is depicted a graph illustrating a probability distribution relating to the reliability of a component or aircraft in an aircraft fleet that is generally designated 40. As illustrated, the probability distribution is a normal distribution wherein the number of component failures is time dependent thus, the probability distribution is a time dependent probability distribution and more specifically, a time to failure probability distribution that may be generated based upon fatigue factors 16 including component strength 18, loads 20 and usage 22. Even though the illustrated probability distribution is a normal distribution, it should be understood by those skilled in the art that any probability distribution of discrete and/or continuous random variables including, but not limited to, log normal distributions and Poisson distributions may alternatively be used. In general, reliability may be defined as the probability that an item or system will operate in a satisfactory manner for a specified period of time when used under a specific set of conditions including environmental and operational conditions. In the present disclosure, it will sometimes be more illustrative to discuss reliability in terms of unreliability, wherein unreliability is the complement of reliability and wherein unreliability may be referred to as the probability of failure. In both cases, reliability and unreliability are generally a function of time with reliability decreasing over time and unreliability increasing over time. As illustrated in FIG. 2, the time to failure for a component is quantified in a probability distribution 42, wherein the reliability (p) at a given point in time (t) is the area 44 under probability distribution curve 42 to the right of timeline 46 and the unreliability (Q) is the area 48 under probability distribution curve 42 to the left of timeline 46. As can be seen, reliability decreases as timeline 46 move to the right while unreliability increases as timeline 46 move to the right, wherein the relationship between unreliability (Q) and reliability (p) is determined according to the formula:

$$(Q)=1-(p).$$

It should be noted that for component reliability, two approaches are commonly used; namely, actuarial and physical. In actuarial reliability analysis, component failures are tracked to build models to predict future failures. In the case of aircraft structural component failures, however, actuarial reliability analysis cannot be relied upon, as actual failures of structural components would lead to an unacceptable level of safety. Accordingly, for such critical components, physical reliability analysis, which relies upon physical models not failure data, is used for reliability prediction.

In reliability analysis of a system, such as an aircraft, the system is made of multiple components, such as rotors, rotor drive systems between the engines and rotor hubs, controls, fuselage, fixed and movable control surfaces, engine and transmission mountings, landing gear, and their related primary attachments. The overall structure of a system plays a key role in determining the impact of a component's reliability on the whole of the system. Two basic structures can be used to represent most systems; namely, parallel structures and series structures. In a parallel structure, a system is said to be functioning if at least one of its components is functioning thus forming a redundant system that continues to function as long as one of the parallel components continues to function. In other words, the reliability of a parallel system is at least as reliable as its most reliable component. In a series structure, however, the system is said to be functioning only if all of its components are functioning, for example, the reliability of a chain is most influenced by its weakest link. In other words, the reliability of a series structure is at most as reliable as its least reliable component.

Applying the system reliability model to aircraft, each aircraft can be considered the system and each critical aircraft component can be considered a component in the system. Likewise, an aircraft fleet can be considered the system and each aircraft can be considered a component in the system. For the purposes of structural reliability and therefore safety of an aircraft fleet, the series structure is the best-suited system reliability model as the fleet is only as reliable as its least reliable aircraft. It is noted that this approach is consistent with safe-life fatigue methodology 12 discussed above which assumes reduced strength (mean—3 sigma), highest flight loads and usage "as severe as expected in service." In other words, safe-life fatigue methodology 12 should generate a component life limit that guarantees the least reliable aircraft is still highly reliable and safe. Accordingly, safe-life fatigue methodology 12 can be used to establish a baseline fleet reliability and modifications to this model can be used to evaluate changes in fleet reliability.

Figure 3:
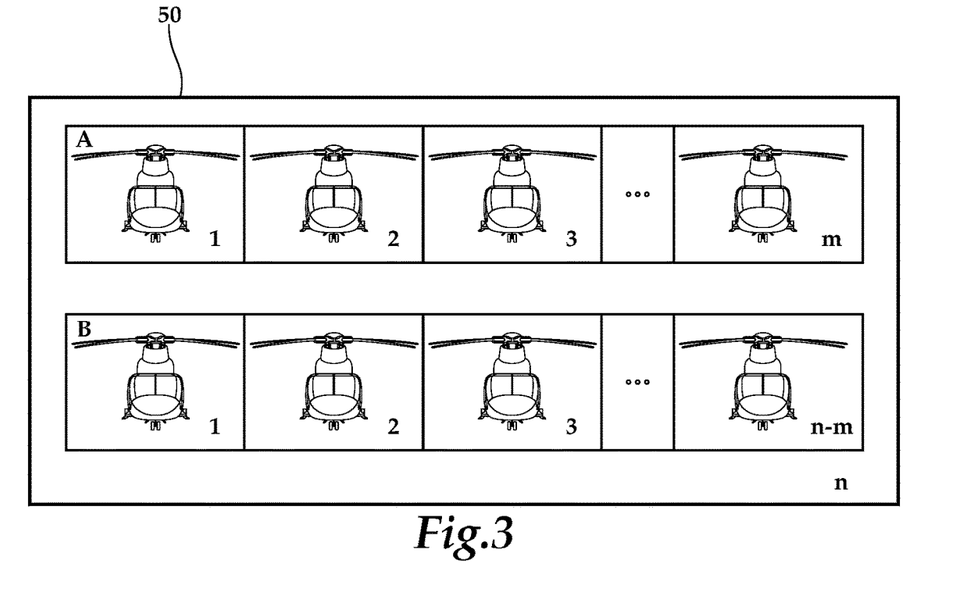
FIG. 3 is a schematic illustration of an aircraft fleet split into two aircraft sub-fleets in accordance with embodiments of the present disclosure.

Using the series structure for system reliability of an aircraft fleet will now be described with reference to FIG. 3. The system reliability of a series structure of independent components is the product of the reliability of the components. For example, if three components in a series structure have reliability values of 0.99, 0.999, and 0.9999 respectively, then the system has a reliability of 0.99×0.999× 0.9999=0.9889. It should be noted that the product of the individual reliabilities is slightly less than the reliability of the component with the lowest reliability in the system. If all of the components can be modeled as having the same reliability, then the system reliability of the series structure of order n becomes:

$$(p_S) = (p_C)^n$$

where $(p_S)$ is the system reliability, $(p_C)$ is the individual component reliability and (n) is the population size or number of components. In the aircraft fleet reliability example, the system is the aircraft fleet, the components are individual aircraft and the population size is the number of aircraft in the fleet. In the case of a fleet of 100 aircraft with an aircraft unreliability of $(Q_C)=1\times10^{-6}$ or reliability of $(p_C)=0.999999$, the fleet reliability would be:

$$(p_S) = (p_C)^{100} = (0.999999)^{100} = 0.9999,$$

which represents a fleet probability of failure or system unreliability of $(Q_S)=1\times10^{-4}$. In the present analysis, those skilled in the art will recognize that an aircraft is made of multiple critical components, which may each have more than one failure mode. Assuming each of these critical components is structurally independent from the others, the components may be viewed a series structure, wherein any component could affect the entire aircraft. Accordingly, the present analysis will discuss aircraft reliability in terms of the portion of the aircraft reliability due to a specific component's reliability.

In the aircraft example presented, all aircraft have been assumed to have the same reliability. Usage monitoring, however, has shown that there exists a wide variation between "normal" usage and "usage as severe as expected." Based upon these differences, an aircraft fleet may be split into multiple sub-fleets based upon usage profiles. For example, using Health and Usage Monitoring System (HUMS) data, one or more usage profiles can be identified from the measured data. As best seen in FIG. 3, an aircraft fleet 50 having a fleet population of (n) aircraft has been split two groups or sub-fleets denoted as sub-fleet (A) and sub-fleet (B). In sub-fleet (A) there are (m) aircraft, where (m)<(n), and in sub-fleet (B) there are (n−m) aircraft. When multiple sub-fleets are included with a fleet, the fleet reliability is determined by combining the sub-fleet reliabilities on a weighted basis. For example, if all of the aircraft in sub-fleet (A) have a reliability value of $(p_A)$ and all of the aircraft in sub-fleet (B) have a reliability value of $(p_B)$, the fleet reliability $(p_F)$ would be determined according to the formula:

$$(p_F) = (p_A)^m \times (p_B)^{n-m}$$

wherein, the contribution of each sub-fleet to the overall fleet reliability is quantified as a function of (1) the reliability associated with the usage profile for each sub-fleet and (2) the size of each sub-fleet. Thus, to determine fleet reliability, the reliability value associated with each of the sub-fleets must be determined. The systems and methods of statistically equivalent level of safety modeling disclosed herein use known and/or assumed distributions of strength 18, loads 20 and usage 22, as best seen in FIG. 1, to generate component time to failure probability distribution functions, such as that shown in FIG. 2, from which reliability values may be determined.

Figure 4A:
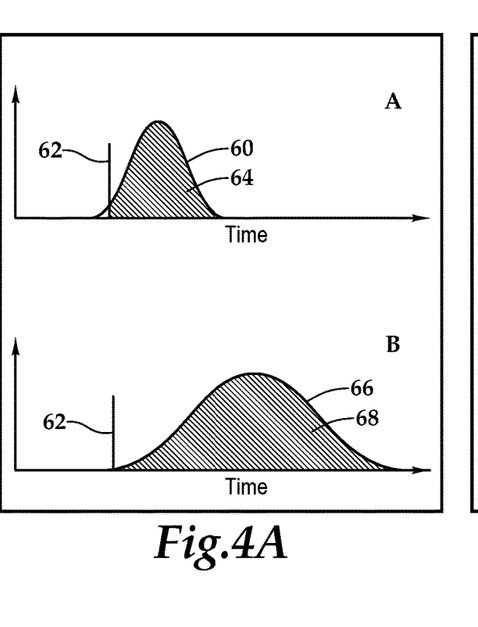
FIGS. 4A-4B show time to failure probability distributions relating to components or aircraft in two aircraft sub-fleets within an aircraft fleet in accordance with embodiments of the present disclosure.

Referring additionally to FIG. 4A, two graphs are depicted illustrating probability distributions relating to sub-fleet (A) and sub-fleet (B), respectively. For example, component/aircraft reliability module 28 may be used to generate time to failure probability distribution functions using a Monte Carlo simulation, Monte Carlo with importance sampling, Markov Chain Monte Carlo simulation, First and Second Order Reliability Methods (FORM/SORM), convolution methods or other suitable probabilistic technique to generate probability distributions representative of the component time to failure functions. The upper graph in FIG. 4A represents a component time to failure probability distribution function 60 for a severe usage profile associated with sub-fleet (A). In the illustrated embodiment, probability distribution function 60 is a normal distribution having a mean of 10,000 hours and a standard deviation of 1,000 hours. Based upon retirement time 24 of safe-life fatigue methodology 12 or other suitable fatigue analysis, the location of a life limit timeline 62 has been determined to be 5,000 hours. As illustrated, the area 64 under probability distribution curve 60 to the right of life limit timeline 62 represents the reliability of the component at the life limit of 5,000 hours. The area 64 can be determined by identifying the location of life limit timeline 62 relative to the mean of the normal distribution in terms of standard deviations according to the formula:

Life Limit=Mean−(x)(standard deviation).

In this case, the life limit is 5,000 hours, the mean is 10,000 and the standard deviation is 1,000 hours. Solving for (x) the formula becomes:

(x)=(Mean−Life Limit)/(standard deviation)=(10,000−5,000)/(1,000)=5

In this case, life limit timeline 62 is 5 standard deviations (5 sigma) from the mean which corresponds to a reliability value $(p_A)$ for sub-fleet (A) of 0.999 993, which can be represented as $(0.9_53)$ meaning five (9s) following the decimal point.

The lower graph in FIG. 4A represents a component time to failure probability distribution function 66 for a normal usage profile associated with sub-fleet (B). In the illustrated embodiment, probability distribution function 66 is a normal distribution having a mean of 15,000 hours and a standard deviation of 1,500 hours. As illustrated, the area 68 under probability distribution curve 66 to the right of life limit timeline 62 represents the reliability of the component at the life limit of 5,000 hours. The area 68 can be determined according to the formula:

(x)=(Mean−Life Limit)/(standard deviation)=(15,000−5,000)/(1,500)=6.667

In this case, life limit timeline 62 is 6.667 standard deviations (6.667 sigma) from the mean which corresponds to a reliability value $(p_B)$ for sub-fleet (B) of 0.999 999 999 02 or $(0.9_902)$.

Using, for example, equivalent fleet reliability module 30, the baseline fleet reliability $(p_F)$ can be determined for a fleet comprised of sub-fleet (A) with reliability value $(p_A)=(0.9_53)$ and a population of 25 aircraft and sub-fleet (B) with reliability value $(p_B)=(0.9_902)$ and a population of 75 aircraft according to the formula:

$$(p_F)=(p_A)^m \times (p_B)^{n-m}=(0.9_53)^{25} \times (0.9_902)^{75}=0.999\ 992\ 83 \text{ or } (0.9_5283)$$

Figure 4B:
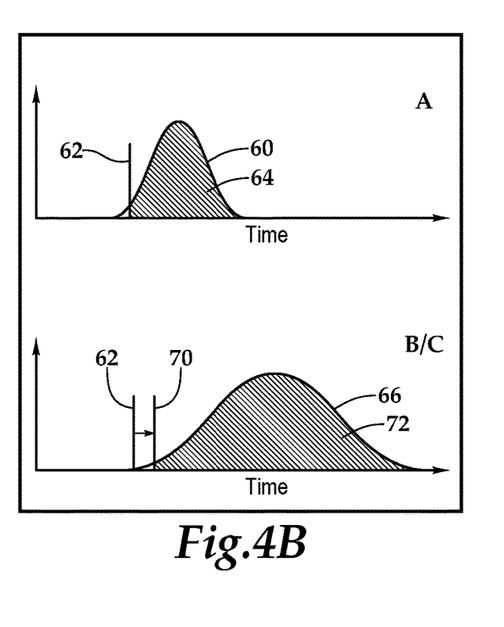

Importantly, this fleet reliability methodology can be used to compare multiple scenarios such as the baseline fleet reliability and a post-credit fleet reliability such that a proposed usage credit can be evaluated in, for example, credit validation module 32. As illustrated in FIG. 4A, the baseline fleet reliability was generated using the severe usage profile of sub-fleet (A) to establish the life limit for both sub-fleet (A) and sub-fleet (B). As best seen in FIG. 4B, sub-fleet (A) retains the life limit of 5,000 hours represented by life limit timeline 62 and thus the reliability value of sub-fleet (A) remains $(p_A)=0.999\ 993$ or $(0.9_53)$. Sub-fleet (B) has been given a credit of 1,000 hours based upon having a normal usage profile and is now designated sub-fleet (B/C) to indicate the credit. As illustrated, the credit shifts the life limit to 6,000 hours, represented by the shift between life limit timeline 62 and life limit timeline 70. As illustrated, the area 72 under probability distribution curve 66 to the right of life limit timeline 70 represents the reliability of the component at the life limit of 6,000 hours. The area 70 can be determined according to the formula:

$$(x) = (\text{Mean} - \text{Life Limit})/(\text{standard deviation}) = (15{,}000 - 6{,}000)/(1{,}500) = 6$$

In this case, life limit timeline 70 is 6 standard deviations (6 sigma) from the mean which corresponds to a post-credit reliability value $(p_{BC})$ for sub-fleet (B) of 0.999 999 926 or $(0.9_726)$.

Using, for example, equivalent fleet reliability module 30, the post-credit fleet reliability $(p_{FC})$ can be determined for a fleet comprised of sub-fleet (A) with reliability value $(p_A)=(0.9_53)$ and a population of 25 aircraft and sub-fleet (B/C) with reliability value $(p_{BC})=(0.9_726)$ and a population of 75 aircraft according to the formula:

$$(p_{FC})=(p_A)^m \times (p_{BC})^{n-m}=(0.9_53)^{25} \times (0.9_726)^{75}=0.999\ 992\ 76 \text{ or } (0.9_5276)$$

Using credit validation module 32, for example, it can be seen that the life limit shift applied to sub-fleet (B) had a slight impact on the overall fleet reliability; namely, baseline fleet reliability $(p_F)=(0.9_5283)$ and post-credit fleet reliability $(p_{FC})=(0.9_5276)$ which is a difference of $(7.399 \times 10^{-8})$ or $(0.000007\%)$. In comparing the baseline fleet reliability $(p_F)$ to the post-credit fleet reliability $(p_{FC})$, it is clear that the change in fleet reliability is very small. Given the magnitude of the numbers, however, it is more revealing to compare baseline fleet unreliability $(Q_F)$ with the post-credit fleet unreliability $(Q_{FC})$ wherein, baseline fleet unreliability is:

$$(Q_F)=(1-(p_F))=(1-(0.9_5283))=(7.16626 \times 10^{-6});$$

and post-credit fleet unreliability is:

$$(Q_{FC})=(1-(p_{FC}))=(1-(0.9_5276))=(7.24026 \times 10^{-6});$$

which is a difference of $7.399 \times 10^{-8}$ or $(1.0\%)$. In the present example, the resulting difference in fleet unreliability is measured against a predetermined threshold value that is selected to yield a statistically equivalent level of fleet safety. If the resulting difference in fleet unreliability is within the allowable threshold of change, then the credit added to sub-fleet (B) for having a normal usage profile is validated and considered a safe usage credit. If on the other hand, the resulting difference in fleet unreliability is not within the allowable threshold of change, then the credit added to sub-fleet (B) is not validated and should be adjusted. In the present example, if the (1.0%) difference in fleet unreliability is within the allowable threshold of change, then the credit of 1,000 hours given to sub-fleet (B) is validated but, if the (1.0%) difference in fleet unreliability is outside the allowable threshold of change, then the credit of 1,000 hours given to sub-fleet (B) is not validated.

Even though the present example has been based upon splitting an aircraft fleet into two aircraft sub-fleets, it should be understood by those skilled in the art that the systems and methods of statistically equivalent level of safety modeling disclosed herein are not limited to aircraft fleets and are not limited to having only two sub-fleets. In fact, the systems and methods of statistically equivalent level of safety modeling disclosed herein are beneficial for use relating to any type of system having structural components subject to fatigue failure, having maintenance schedules and/or having life limits. In addition, a fleet or system may be split into more than two groups based upon a variety factors such as the usage profiles in the present example. Further, each such group may receive a varying grade of credit based upon the differences in the factors defining the groups such as differences in the usage profiles.

Those skilled in the art will also understand that the use of this "relative reliability" approach produces a valid comparison as long as the assumptions used while generating baseline and post-credit fleet reliability are applicable. For example, even though load variability is sometimes difficult to quantify, if the same assumptions for load variability are used in both the baseline and post-credit fleet reliability cases, then the relative impact of the usage credit can be evaluated without concern for the absolute validity of the assumption so long as load variability is reasonably independent from usage. In this manner, the load variability assumptions used in both the baseline and post-credit fleet reliability cases "cancel out" in the end result.

Figure 5:
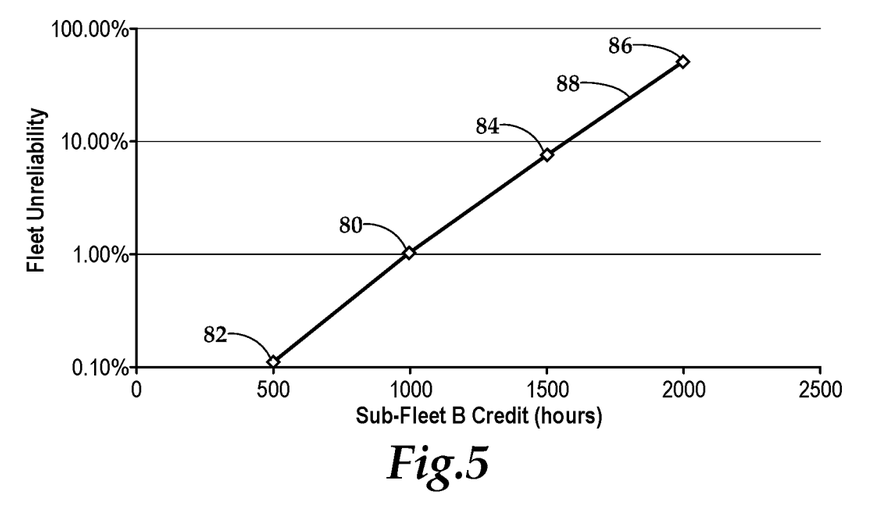
FIGS. 5-6 are Credit Hours versus Fleet Unreliability plots relating to components or aircraft within an aircraft fleet in accordance with embodiments of the present disclosure.

Referring now to FIG. 5 of the drawings, a graph illustrates the fleet unreliability sensitivity to credit given to a sub-fleet. Continuing with the example presented above, when sub-fleet (B) is given a credit of 1,000 hours based upon having a normal usage profile and sub-fleet (A) is given no credit based upon having a severe usage profile, the resulting post-credit fleet unreliability is $(Q_{FC})=(7.24026 \times 10^{-6})$ which is a (1.0%) difference from the baseline fleet unreliability $(Q_F)=(7.16626 \times 10^{-6})$ as indicated by data point 80. Using the systems and methods for statistically equivalent level of safety modeling disclosed herein, additional data points, trend data and sensitivity information can be generated. For example, fleet unreliability sensitivity can be determined by processing a plurality of credit levels as described above. As illustrated, if sub-fleet (B) is given a credit of 500 hours instead of 1,000 hours, the resultant difference between post-credit fleet unreliability and baseline fleet unreliability is approximately (0.1%) as indicated by data point 82. Similarly, if sub-fleet (B) is given a credit of 1500 hours instead of 1,000 hours, the resultant difference between post-credit fleet unreliability and baseline fleet unreliability is approximately (8.5%) as indicated by data point 84 and if sub-fleet (B) is given a credit of 2000 hours instead of 1,000 hours, the resultant difference between post-credit fleet unreliability and baseline fleet unreliability is approximately (50%) as indicated by data point 86. Together, data points 80, 82, 84 and 86 define a trend line 88 that can be used as an aid in selecting a safe usage credit that is within the predetermined threshold, thus yielding a statistically equivalent level of safety in post-credit fleet unreliability when compared to baseline fleet unreliability. Such a trend line is also useful in determining how sensitive the fleet unreliability is to changes in the credit value. For example, in a highly sensitive system, it may be desirable to select a more conservative credit or to reset the predetermined threshold.

Figure 6:
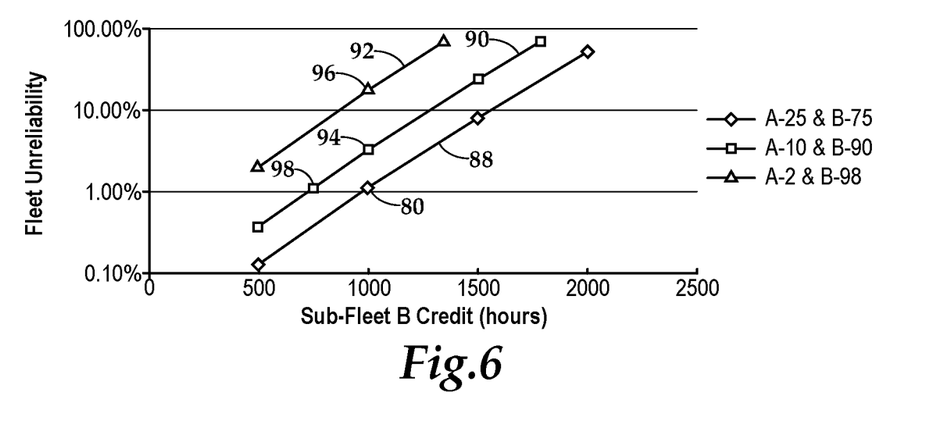

Similar methods may be used to test fleet unreliability sensitivity to other variables. For example, as best seen in FIG. 6 of the drawings, a graph illustrates the fleet unreliability sensitivity to changes in the population ratio of the sub-fleets. Continuing with the example presented above, trend line 88 has been reproduced illustrating the change in fleet unreliability based upon changes in the credit given to sub-fleet (B) for a fleet having a population of 25 aircraft in sub-fleet (A) and 75 aircraft in sub-fleet (B). Using the systems and methods for statistically equivalent level of safety modeling disclosed herein, additional data points, trend data and sensitivity information can be generated. For example, trend line 90 represents credit given to sub-fleet (B) in a fleet having a population of 10 aircraft in sub-feet (A) and 90 aircraft in sub-fleet (B). Similarly, trend line 92 represents credit given to sub-fleet (B) in a fleet having a population of 2 aircraft in sub-feet (A) and 98 aircraft in sub-fleet (B). As illustrated, as the population in the sub-fleet receiving credit goes up, the difference between the baseline fleet unreliability and the post-credit fleet unreliability also goes up. For example, as indicated at data point 80, when sub-fleet (B) is given a credit of 1,000 hours and sub-fleet (A) is given no credit, the resulting difference between post-credit fleet unreliability and baseline fleet unreliability is (1.0%). As indicated by data point 94, for a 1,000 hour credit given to sub-fleet (B), when sub-fleet (A) has 10 aircraft and sub-feet (B) has 90 aircraft, the resultant difference between post-credit fleet unreliability and baseline fleet unreliability is approximately (3%). Likewise, as indicated by data point 96, for a 1,000 hour credit given to sub-fleet (B), when sub-fleet (A) has 2 aircraft and sub-fleet (B) has 98 aircraft, the resultant difference between post-credit fleet unreliability and baseline fleet unreliability is approximately (20%). Similarly, as indicated by data point 98, if the threshold of change to yield a statistically equivalent level of safety in post-credit fleet unreliability when compared to baseline fleet unreliability is predetermined to be (1%), for a fleet having 10 aircraft in sub-fleet (A) and 90 aircraft in sub-fleet (B), the maximum safe usage credit is about 750 hours.

Figure 7:
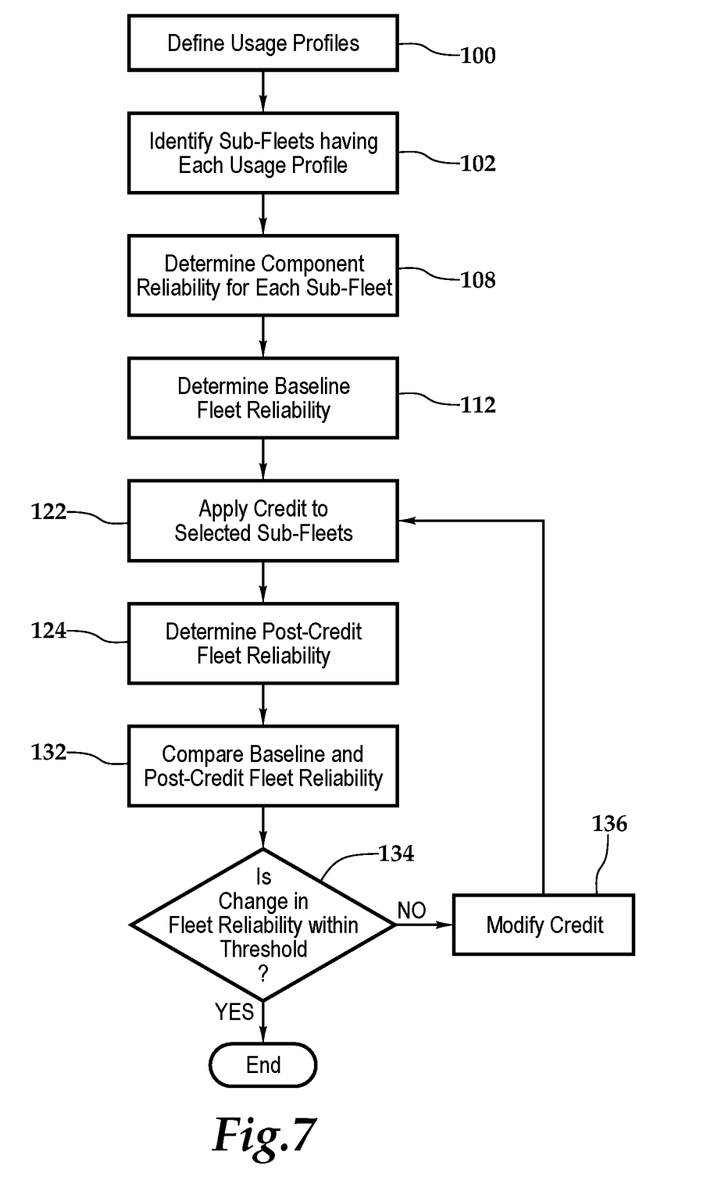
FIG. 7 is a flow diagram of a process of statistically equivalent level of safety modeling relating to components or aircraft within an aircraft fleet in accordance with embodiments of the present disclosure.

Referring now to FIG. 7 of the drawings, one embodiment of a process for statistically equivalent level of safety modeling relating to aircraft components of aircraft within an aircraft fleet will now be described. The first step of the process involves defining usage profiles as indicated in block 100. Usage profiles may be component dependent, so a first part of this portion of the process may involve identifying candidate components. Once selected, a review of the baseline fatigue substantiation for the component including, for example, review of safe-life fatigue methodology 12, will determine what parameters most influence the fatigue life. Once determined, a usage threshold or thresholds must be established which categorize all aircraft in the fleet into one and only one usage profile, as indicated in block 102.

Figure 8:
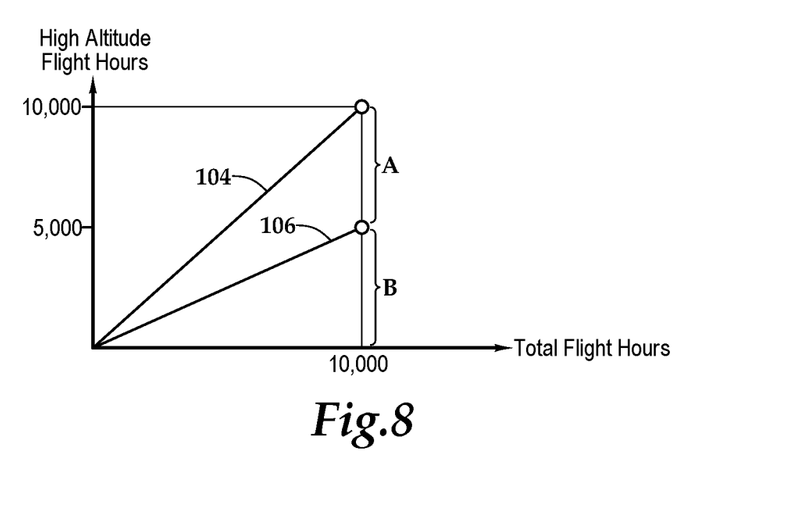
FIG. 8 is a Total Flight Hours versus High Altitude Flight Hours plots relating to components or aircraft within an aircraft fleet in accordance with embodiments of the present disclosure.

For example, density altitude may be a parameter that correlates to fatigue damage to a selected component resulting in a baseline fatigue retirement life of 10,000 hours. If it is shown from the baseline fatigue substantiation that there is a significant difference in fatigue damage above a certain density altitude threshold, such as significant fatigue damage above 6,000 feet density altitude, but no fatigue damage below 6,000 feet density altitude, then this forms a suitable threshold between usage states. Any aircraft, however, could spend some time above and some time below the 6,000 feet threshold on a given flight. To ensure aircraft can only be categorized into a single group, the time dimension must be considered. As best seen in FIG. 8, flight time for aircraft at high altitude is represented by the vertical axis and total flight time is represented by the horizontal axis, wherein the high altitude state corresponds to the 6,000 feet threshold. An aircraft that spends all of its time in high altitude would be represented by usage profile line 104 and an aircraft that spends 50% of its time at high altitude would be represented by usage profile line 106. Thus, at 10,000 hours of total flight time, a component subject to density altitude related fatigue damage at high altitude in an aircraft having usage profile 104 would have reached the 10,000 hours life limit of that component for high altitude flight. The same component in an aircraft having usage profile 106, however, would have only experienced 5,000 hours of high altitude fight time in its 10,000 hours of total flight time. Utilizing this information, sub-fleets can be defined that include all aircraft in the fleet. For example, a sub-fleet (A) could be defined by the usage profile of spending between 50% and 100% of fight time at high altitude. Similarly, a sub-fleet (B) could be defined by the usage profile of spending between 0% and 50% of flight time at high altitude.

Figure 9:
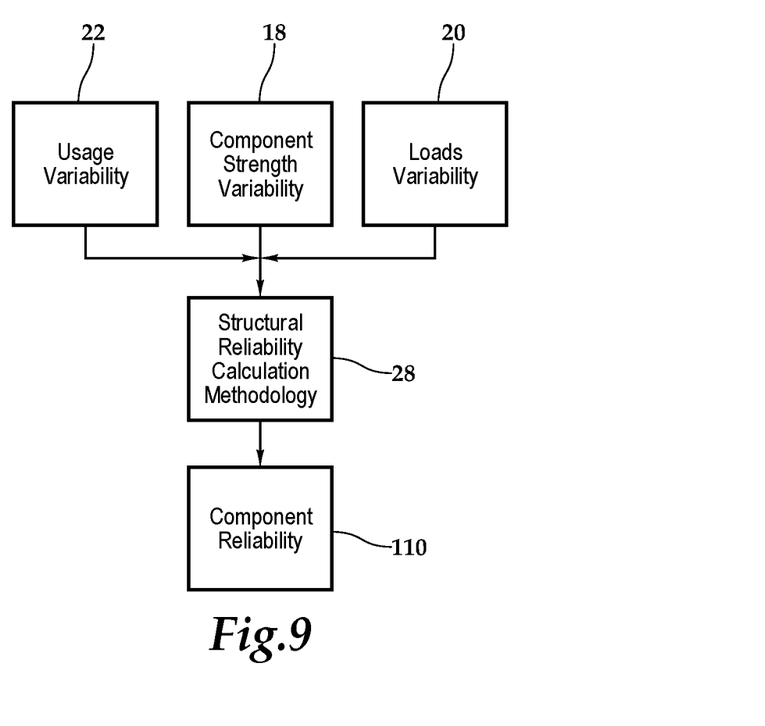
FIG. 9 is a flow diagram of a process of determining component reliability for aircraft sub-fleets within an aircraft fleet in accordance with embodiments of the present disclosure.

Returning to FIG. 7, the next step in the process involves the calculation of the structural reliability for each identified sub-fleet as indicated in block 108. This step generates time to failure probability distribution functions for each sub-fleet, as described above with reference to FIG. 4A. Component fatigue substantiation; namely, strength 18, loads 20 and usage 22, provide inputs to this process, as best seen in FIG. 9. The component strength variability and loads variability information typically come from the safe-life fatigue methodology 12 and usage variability may be estimated. For example, estimating usage distribution involves a characterization of actual fleet operations or, in the case of a new aircraft design, expected fleet operations based upon data from other operational aircraft. For an existing aircraft, HUMS data recorded from the fleet may be used for this purpose. It should be noted that any estimate should take into consideration the frequency of occurrence spectrum based upon information that is applicable to the missions flown by the fleet. Next, component/aircraft reliability module 28 may be used to generate time to failure probability distribution functions for each sub-fleet, referred to as component reliability in block 110.

Figure 10:
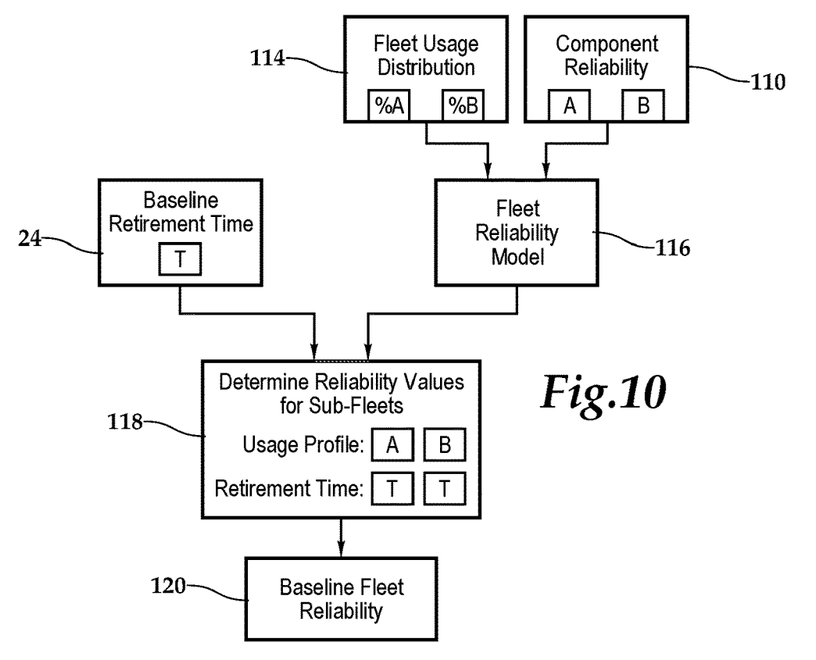
FIG. 10 is a flow diagram of a process of determining baseline fleet reliability for an aircraft fleet in accordance with embodiments of the present disclosure.

Referring again to FIG. 7, the next step in the process involves the calculation of the baseline fleet reliability as indicated in block 112. This process may occur within equivalent fleet reliability module 30. The component reliability information 110 is now combined with fleet usage distribution information 114 (see discussion referencing FIG. 8) to establish a fleet reliability model 116, as best seen in FIG. 10. The fleet reliability model 116 includes the population of each sub-fleet by actual count or by percentage as well as the time to failure probability distribution functions for each sub-fleet. This information is used to determine the reliability value for each sub-fleet in block 118. This involves using the baseline fatigue retirement life 24 from the safe-life fatigue methodology 12 in combined with the time to failure probability distribution functions of each sub-fleet as described above with reference to FIG. 4A. For example, in a fleet of (n) aircraft, (m) aircraft are selected for inclusion in sub-fleet (A) based upon spending 50%-100% of their flight time at high altitude while (n−m) aircraft are selected for inclusion in sub-fleet (B) based upon spending 0%-50% of their flight time at high altitude. If a component subject to density altitude related fatigue damage at high altitude has a life limit of 10,000 hours, both sub-fleet (A) and sub-fleet (B) are assigned this life limit. The component and/or aircraft reliability value for each sub-fleet is now determined by processing the life limit information together with the time to failure probability distribution functions of each sub-fleet, as described above with reference to FIG. 4A. The baseline fleet reliability is now determined in block 120 by combining the sub-fleet reliability values on a weighted basis such as by multiplying together the sub-fleet reliability values raised to the sub-fleet population for each aircraft sub-fleet, as described above with reference to FIG. 4A.

The next step in the process of FIG. 7 is applying a usage credit to selected sub-fleets as indicated in block 122. This process involves determining which sub-fleet or sub-fleets should receive credit and the type of credit to be applied. For example, in the previous discussion, the credit has involved a shift in the life limit, which grants a singular amount of credit to all members of a population group, the 1,000 hour credit applied to sub-fleet (B) as described above with reference to FIG. 4B. In addition to shifting the entire group by a set amount of credit, another credit options include applying a factor to the usage of one or more sub-fleets. For example, a credit factor would be to count every hour as less than one hour of "equivalent time." If a factor of 0.8 were determined to be appropriate, then 5,000 hours of actual usage would equate to 5,000 hours×0.8=4,000 hours of equivalent usage, which is an effective credit of 1,000 hours. Once a value for the credit is proposed, a complete usage proposal can be stated such as "A credit shift of 1,000 hours is proposed for all aircraft in sub-fleet (B)."

Figure 11:
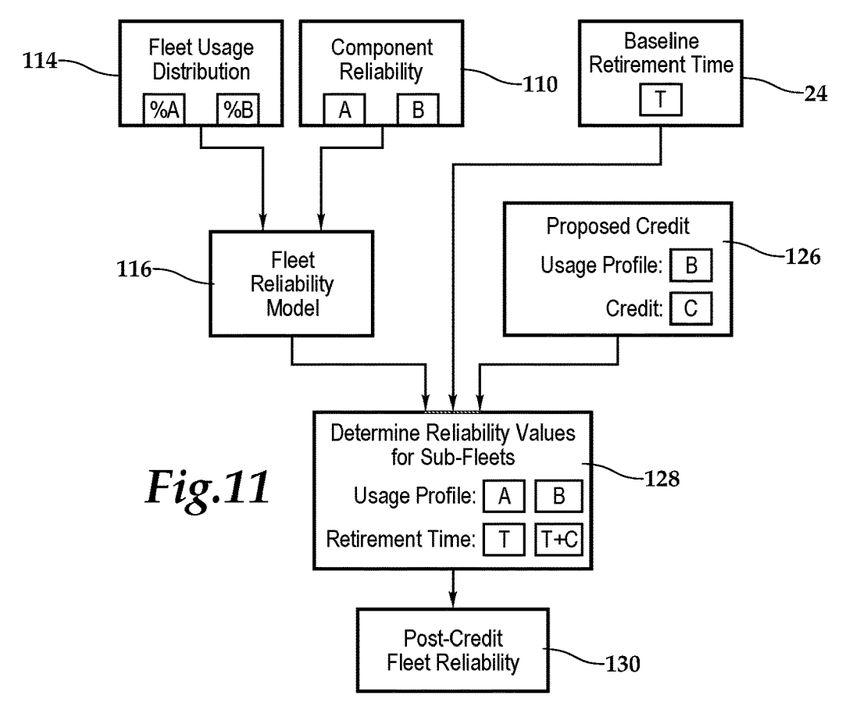
FIG. 11 is a flow diagram of a process of determining post-credit fleet reliability for an aircraft fleet in accordance with embodiments of the present disclosure.

Post-credit fleet reliability can now be determined as indicated in block 124. This process may occur within equivalent fleet reliability module 30. The component reliability information 110, fleet usage distribution information 114 and fleet reliability model 116, previous generated are used again as best seen in FIG. 11. The fleet reliability model 116 includes the population of each sub-fleet by actual count or by percentage as well as the time to failure probability distribution functions for each sub-fleet. This information is used to determine the post-credit reliability value for each sub-fleet in block 128. This involves using the baseline fatigue retirement life 24 from the safe-life fatigue methodology 12 in combined with the time to failure probability distribution functions of each sub-fleet that does not receive a credit as described above with reference to FIG. 4B. In addition, a credit-based life limit from block 126 is used in combined with the time to failure probability distribution functions of each sub-fleet receiving a credit as described above with reference to FIG. 4B. For example, in a fleet of (n) aircraft, (m) aircraft are selected for inclusion in sub-fleet (A) based upon spending 50%-100% of their flight time at high altitude while (n−m) aircraft are selected for inclusion in sub-fleet (B) based upon spending 0%-50% of their flight time at high altitude. If a component subject to density altitude related fatigue damage at high altitude has a life limit of 10,000 hours, sub-fleet (A) is assigned this life limit but sub-fleet (B) is given a credit of 1,000 hours. The component and/or aircraft post-credit reliability value for each sub-fleet is now determined by processing the life limit information together with the time to failure probability distribution functions of each sub-fleet, as described above with reference to FIG. 4B. The post-credit fleet reliability is now determined in block 130 by combining the sub-fleet reliability values on a weighted basis such as by multiplying together the sub-fleet reliability values raised to the sub-fleet population for each aircraft sub-fleet, as described above with reference to FIG. 4B.

Returning to FIG. 7, the next step in the process involves comparing the baseline fleet reliability with the post-credit fleet reliability as indicated in block 132. This process may occur within credit validation module 32. Taking the example from FIGS. 4A-4B, adding the life limit shift to sub-fleet (B) had a slight impact on the overall fleet reliability which can be quantified as the difference between baseline fleet reliability $(p_F)=(0.9_5283)$ and post-credit fleet reliability $(p_{FC})=(0.9_5276)$ which is $(7.399\times10^{-8})$ or (0.000007%). Making the same comparison using fleet unreliability yields the difference between baseline fleet unreliability $(Q_F)=(7.16626\times10^{-6})$ and post-credit fleet unreliability $(Q_{FC})=(7.24026\times10^{-6})$ is $(7.399\times10^{-8})$ or (1.0%). Once the change in overall fleet unreliability has been determined, it is compared to the predetermined threshold in decision block 134. Preferably, the predetermined threshold is selected such that post-credit fleet reliability and baseline fleet reliability have a statistically equivalent level of safety. In the present example, if the (1.0%) difference in fleet unreliability is within the predetermined threshold, then the credit of 1,000 hours given to sub-fleet (B) is validated and the process is complete. If, however, the (1.0%) difference in fleet unreliability is outside the predetermined threshold, then the credit of 1,000 hours given to sub-fleet (B) is not validated and a modified credit may be proposed as indicated in block 136. The process would return to block 122 enabling the modified credit to be tested in and potentially validated by the statistically equivalent level of safety modeling process of the present disclosure.

Embodiments of methods, systems and program products of the present disclosure have been described herein with reference to drawings. While the drawings illustrate certain details of specific embodiments that implement the methods, systems and program products of the present disclosure, the drawings should not be construed as imposing on the disclosure any limitations that may be present in the drawings. The embodiments described above contemplate methods, systems and program products stored on any non-transitory machine-readable storage media for accomplishing its operations. The embodiments may be implemented using an existing computer processor or by a special purpose computer processor incorporated for this or another purpose or by a hardwired system.

Certain embodiments can include program products comprising non-transitory machine-readable storage media for carrying or having machine-executable instructions or data structures stored thereon. Such machine-readable media may be any available media that may be accessed by a general purpose or special purpose computer or other machine with a processor. By way of example, such machine-readable storage media may comprise RAM, ROM, EPROM, EEPROM, CD-ROM or other optical disk storage, magnetic disk storage or other magnetic storage devices, or any other medium which may be used to carry or store desired program code in the form of machine-executable instructions or data structures and which may be accessed by a general purpose or special purpose computer or other machine with a processor. Combinations of the above are also included within the scope of machine-readable media. Machine-executable instructions comprise, for example, instructions and data which cause a general purpose computer, special purpose computer or special purpose processing machines to perform a certain function or group of functions.

Embodiments of the present disclosure have been described in the general context of method steps which may be implemented in one embodiment by a program product including machine-executable instructions, such as program code, for example in the form of program modules executed by machines in networked environments. Generally, program modules include routines, programs, logics, objects, components, data structures, and the like that perform particular tasks or implement particular abstract data types. Machine-executable instructions, associated data structures and program modules represent examples of program code for executing steps of the methods disclosed herein. The particular sequence of such executable instructions or associated data structures represents examples of corresponding acts for implementing the functions described in such steps.

Embodiments of the present disclosure may be practiced in a networked environment using logical connections to one or more remote computers having processors. Those skilled in the art will appreciate that such network computing environments may encompass many types of computers, including personal computers, hand-held devices, multi-processor systems, microprocessor-based or programmable consumer electronics, network PCs, minicomputers, mainframe computers, and so on. Embodiments of the disclosure may also be practiced in distributed computing environments where tasks are performed by local and remote processing devices that are linked through a communications network including hardwired links, wireless links and/or combinations thereof. In a distributed computing environment, program modules may be located in both local and remote memory storage devices.

An exemplary implementation of embodiments of methods, systems and program products disclosed herein might include general purpose computing computers in the form of computers, including a processing unit, a system memory or database, and a system bus that couples various system components including the system memory to the processing unit. The database or system memory may include read only memory (ROM) and random access memory (RAM). The database may also include a magnetic hard disk drive for reading from and writing to a magnetic hard disk, a magnetic disk drive for reading from or writing to a removable magnetic disk and an optical disk drive for reading from or writing to a removable optical disk such as a CD ROM or other optical media. The drives and their associated machine-readable media provide nonvolatile storage of machine-executable instructions, data structures, program modules and other data for the computer. User interfaces, as described herein may include a computer with monitor, keyboard, a keypad, a mouse, joystick or other input devices performing a similar function.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure. Such variations will depend on the software and hardware systems chosen and on designer choice. It is understood that all such variations are within the scope of the present disclosure. Likewise, software and web implementations of the present disclosure could be accomplished with standard programming techniques using rule based logic and other logic to accomplish the various processes.

The foregoing description of embodiments of the disclosure has been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated. Other substitutions, modifications, changes and omissions may be made in the design, operating conditions and arrangement of the embodiments without departing from the scope of the present disclosure. Such modifications and combinations of the illustrative embodiments as well as other embodiments will be apparent to persons skilled in the art upon reference to the description. It is, therefore, intended that the appended claims encompass any such modifications or embodiments.

What is claimed is:

1. A method for safely extending scheduled maintenance intervals for structural components of aircraft within an aircraft fleet, the structural components subject to scheduled maintenance based upon component life limits, the method comprising:
   (A). identifying aircraft sub-fleets within the aircraft fleet based upon aircraft usage profiles, each aircraft sub-fleet having a sub-fleet population;
   (B). determining a sub-fleet reliability value for each aircraft sub-fleet based upon a component life limit of a structural component;
   (C). determining a baseline fleet reliability for the aircraft fleet by multiplying together the sub-fleet reliability values raised to the sub-fleet population for each aircraft sub-fleet;
   (D). applying at least one credit to the component life limit of the structural component of the aircraft in at least one aircraft sub-fleet;
   (E). determining a post-credit sub-fleet reliability value for each aircraft sub-fleet based upon the component life limit with the at least one credit;
   (F). determining a post-credit fleet reliability for the aircraft fleet by multiplying together the post-credit sub-fleet reliability values raised to the sub-fleet population for each aircraft sub-fleet;
   (G). comparing the baseline fleet reliability with the post-credit fleet reliability to identify a change in fleet reliability;
   (H). determining whether the change in fleet reliability is within a predetermined threshold to validate the at least one credit applied to the component life limit of the structural component of the aircraft in the at least one aircraft sub-fleet; and
   (I). when at least one credit is validated, extending the scheduled maintenance interval for the structural component of the aircraft in the at least one aircraft sub-fleet such that maintenance is carried out on the structural component of the aircraft in the at least one aircraft sub-fleet according to an extended scheduled maintenance interval.

2. The method as recited in claim 1 wherein the usage profiles are based upon measured usage levels.

3. The method as recited in claim 1 wherein the reliability values further comprise time dependent probability distribution functions.

4. The method as recited in claim 1 wherein the reliability values further comprise probability distribution functions selected from the group consisting of probability distribution functions of discrete random variables, probability distribution functions of continuous random variables, normal distribution functions, lognormal distribution functions and Poisson distribution functions.

5. The method as recited in claim 1 wherein the reliability values relate to one or more structural components of the aircraft of the aircraft sub-fleets.

6. The method as recited in claim 1 wherein the reliability values further comprise probability distribution functions based upon strength, loads and usage of the aircraft of the aircraft sub-fleets.

7. The method as recited in claim 1 wherein the at least one credit is selected from the group consisting of life limit shifts, life factors and combination thereof.

8. The method as recited in claim 1 further comprising applying at least one revised credit to the at least one aircraft sub-fleet when change in fleet reliability is not within the predetermined threshold and repeating steps (E)-(H).

9. A system for safely extending scheduled maintenance intervals for structural components of aircraft within an aircraft fleet, the structural components subject to scheduled maintenance based upon component life limits, the system comprising:
a computing system having logic stored within a non-transitory computer readable medium, the logic executable by a processor, wherein the computing system is configured to:
(A). identify aircraft sub-fleets within the aircraft fleet based upon aircraft usage profiles, each aircraft sub-fleet having a sub-fleet population;
(B). determine a sub-fleet reliability value for each aircraft sub-fleet based upon a component life limit of a structural component;
(C). determine a baseline fleet reliability for the aircraft fleet by multiplying together the sub-fleet reliability values raised to the sub-fleet population for each aircraft sub-fleet;
(D). apply at least one credit to the component life limit of the structural component of the aircraft in at least one aircraft sub-fleet;
(E). determine a post-credit sub-fleet reliability value for each aircraft sub-fleet based upon the component life limit with the at least one credit;
(F). determine a post-credit fleet reliability for the aircraft fleet by multiplying together the post-credit sub-fleet reliability values raised to the sub-fleet population for each aircraft sub-fleet;
(G). compare the baseline fleet reliability with the post-credit fleet reliability to identify a change in fleet reliability; and
(H). determine whether the change in fleet reliability is within a predetermined threshold to validate the at least one credit applied to the component life limit of the structural component of the aircraft in the at least one aircraft sub-fleet;
wherein, when at least one credit is validated, the scheduled maintenance interval for the structural component of the aircraft in the at least one aircraft sub-fleet is extended such that maintenance is carried out on the structural component of the aircraft in the at least one aircraft sub-fleet according to an extended scheduled maintenance interval.

10. The system as recited in claim 9 wherein the usage profiles are based upon measured usage levels.

11. The system as recited in claim 9 wherein the reliability values further comprise time dependent probability distribution functions.

12. The system as recited in claim 9 wherein the reliability values further comprise probability distribution functions selected from the group consisting of probability distribution functions of discrete random variables, probability distribution functions of continuous random variables, normal distribution functions, lognormal distribution functions and Poisson distribution functions.

13. The system as recited in claim 9 wherein the reliability values relate to one or more structural components of the aircraft of the aircraft sub-fleets.

14. The system as recited in claim 9 wherein the reliability values further comprise probability distribution functions based upon strength, loads and usage of the aircraft of the aircraft sub-fleets.

15. The system as recited in claim 9 wherein the at least one credit is selected from the group consisting of life limit shifts, life factors and combination thereof.

16. The system as recited in claim 9 wherein the computing system is further configured to apply at least one revised credit to the at least one aircraft sub-fleet when change in fleet reliability is not within the predetermined threshold and to repeat processes (E)-(H).

17. A non-transitory computer readable storage medium comprising a set of computer instructions executable by a processor for operating a safety modeling computing system for safely extending scheduled maintenance intervals for structural components of aircraft within an aircraft fleet, the structural components subject to scheduled maintenance based upon component life limits, the computer instructions configured to:
(A). identify aircraft sub-fleets within the aircraft fleet based upon aircraft usage profiles, each aircraft sub-fleet having a sub-fleet population;
(B). determine a sub-fleet reliability value for each aircraft sub-fleet based upon a component life limit of a structural component;
(C). determine a baseline fleet reliability for the aircraft fleet by multiplying together the sub-fleet reliability values raised to the sub-fleet population for each aircraft sub-fleet;
(D). apply at least one credit to the component life limit of the structural component of the aircraft in at least one aircraft sub-fleet;
(E). determine a post-credit sub-fleet reliability value for each aircraft sub-fleet based upon the component life limit with the at least one credit;
(F). determine a post-credit fleet reliability for the aircraft fleet by multiplying together the post-credit sub-fleet reliability values raised to the sub-fleet population for each aircraft sub-fleet;
(G). compare the baseline fleet reliability with the post-credit fleet reliability to identify a change in fleet reliability; and
(H). determine whether the change in fleet reliability is within a predetermined threshold to validate the at least one credit applied to the component life limit of the structural component of the aircraft in the at least one aircraft sub-fleet;

wherein, when at least one credit is validated, the scheduled maintenance interval for the structural component of the aircraft in the at least one aircraft sub-fleet is extended such that maintenance is carried out on the structural component of the aircraft in the at least one aircraft sub-fleet according to an extended scheduled maintenance interval.

18. The non-transitory computer readable storage medium as recited in claim 17 wherein the computer instructions are further configured to apply at least one revised credit to the at least one aircraft sub-fleet when change in fleet reliability is not within the predetermined threshold and repeat processes (E)-(H).

* * * * *